(12) United States Patent
Bouin et al.

(10) Patent No.: US 10,320,406 B2
(45) Date of Patent: Jun. 11, 2019

(54) METHOD FOR SYNCHRONIZING DATA CONVERTERS BY MEANS OF A SIGNAL TRANSMITTED FROM ONE TO THE NEXT

(71) Applicant: Teledyne e2v Semiconductors SAS, Saint Egrève (FR)

(72) Inventors: Etienne Bouin, Brignoud (FR); Rémi Laube, Veurey-voroize (FR); Jérôme Ligozat, Grenoble (FR); Marc Stackler, St Martin le Vinoux (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 15/774,455

(22) PCT Filed: Nov. 4, 2016

(86) PCT No.: PCT/EP2016/076689
§ 371 (c)(1),
(2) Date: May 8, 2018

(87) PCT Pub. No.: WO2017/080925
PCT Pub. Date: May 18, 2017

(65) Prior Publication Data
US 2018/0323794 A1 Nov. 8, 2018

(30) Foreign Application Priority Data
Nov. 10, 2015 (FR) ..................... 15 60739

(51) Int. Cl.
*H03K 5/00* (2006.01)
*H03M 1/06* (2006.01)
(Continued)

(52) U.S. Cl.
CPC ........ *H03M 1/0624* (2013.01); *H03K 5/1534* (2013.01); *H03M 1/123* (2013.01);
(Continued)

(58) Field of Classification Search
None
See application file for complete search history.

(56) References Cited

U.S. PATENT DOCUMENTS

| 5,856,800 A | 1/1999 | Le Pailleur et al. |
| 7,728,753 B2 * | 6/2010 | Taft ..................... H03M 1/0624 341/165 |

(Continued)

FOREIGN PATENT DOCUMENTS

| DE | 102004050648 A1 | 4/2006 |
| EP | 0798863 A1 | 10/1997 |

OTHER PUBLICATIONS

Goswami B et al., Using ADS8410/13 in Daisy-Chain Mode, Texas Instruments Application Report SLAA296, May 2006 (Year: 2006).*
(Continued)

*Primary Examiner* — Howard Williams
(74) *Attorney, Agent, or Firm* — Pilloff & Passino LLP; Sean A. Passino; Rachel K. Pilloff (57) ABSTRACT

In an architecture for processing data comprising a control unit and converters $CN_j$ to be synchronized to an active front of a common reference clock CLK, the synchronizing method makes provision for the converters to be arranged in at least one series chain, and for a procedure for synchronizing the converters by propagating a synchronizing signal SYNC-m emitted by the control unit, said signal being retransmitted as output OUT by each converter, after resynchronization to a clock active front, to a synchronization input IN of a following converter in the chain. Each converter comprises a synchronization configuration register (Continued)

REG containing at least one polarity parameter Sel-edge$_j$ that sets the polarity of the reference-clock front for reliable detection of a synchronizing signal received via the input of the converter. A phase parameter Sel-shift$_j$ furthermore allows the phase of the sampling clocks of n converting cores of the converters, working at a sampling frequency obtained by dividing by n the CLK reference-clock frequency, to be synchronized.

20 Claims, 8 Drawing Sheets

(51) Int. Cl.
  *H03M 1/12* (2006.01)
  *H04L 7/00* (2006.01)
  *H03K 5/1534* (2006.01)
(52) U.S. Cl.
  CPC .. *H04L 7/0008* (2013.01); *H03K 2005/00267* (2013.01); *H03M 1/1215* (2013.01)

(56) References Cited

U.S. PATENT DOCUMENTS

| | | | |
|---|---|---|---|
| 9,680,491 B2* | 6/2017 | Iwashita | G06F 13/4247 |
| 2006/0112293 A1* | 5/2006 | Przybysz | H03M 9/00 |
| | | | 713/400 |
| 2008/0094265 A1 | 4/2008 | Kufer | |
| 2014/0010317 A1* | 1/2014 | Oshikiri | H04L 7/0012 |
| | | | 375/259 |

OTHER PUBLICATIONS

Dhaker P., Introduction to SPI Interface, Analog Devices, Analog Dialogue 52-09, Sep. 2018 (Year: 2018).*
"Synchronizing Multiple High-Speed Multiplexed DACs for Transmit Applications," Sep. 21, 2006, Retrieved from https://www.maximintegrated.com/en/app-notes/index.mvp/id/3901, last checked on May 7, 2018.
International Search Report and Written Opinion for PCT/EP2016/076689, dated Feb. 20, 2017.

* cited by examiner

METHOD FOR SYNCHRONIZING DATA CONVERTERS BY MEANS OF A SIGNAL TRANSMITTED FROM ONE TO THE NEXT

TECHNICAL FIELD

The invention relates to the synchronization of analogue-digital and/or digital-analogue data converters. It more particularly relates to rapid converters the working frequency of which is about one hundred megahertz and higher. The invention is in particular applicable to systems that require a plurality of these rapid converters to be synchronized, such as for example antenna arrays or systems for communicating data using I/Q modulation.

Technical Problem

Rapid converters are generally formed from two or more converter cores that each work at a lower working (sampling) frequency, and the output signals of which are combined (interleaved) to obtain the expected conversion frequency. The sampling clocks of these converters are thus usually generated internally by a clock generator that performs a frequency division of the reference clock. If there are n converting cores per converter, the sampling frequency is obtained from the reference clock CLK by dividing its frequency by n.

In an architecture including a plurality of converters, it is necessary to be able to synchronize the converters, to make them start in phase. In the case of rapid converters, it is a question of starting the frequency dividers in phase, i.e. it is not enough to say that they are reset synchronously to a reference-clock active front, it is also necessary to know which active front is being spoken of, otherwise the sampling clocks obtained will possibly not all be in phase depending on whether the frequency dividers start on a given clock active front or the following one.

One of the known solutions of this problem is to use a signal (usually called a synchronizing signal) that is a pulse distributed in phase to all the converters and the distribution of which is designed to obtain the appropriate propagation time for each converter, so that the clock active fronts on which the frequency dividers are initialized correspond, i.e. pairwise these active fronts are all separated by a number of reference-clock periods that is a multiple of n: 0, n, 2×n, etc. Everything is determined by the design of the pathways for distributing the reference clock and the synchronizing signal to each of the converters.

This technique thus requires the distribution of the reference clock and the synchronizing signal to be very carefully designed, which requires propagation delays on the electrically conductive pathways carrying these signals to each of the converters in a given architecture to be precisely evaluated. It is a question of taking into account all the parameters influencing propagation: length and materials of the conductors, characteristics of the input and output stages of the signals, characteristics of solder joints, etc. Although it is known how to do this rather well at low frequencies, in the rapid systems with which we are concerned, which have working frequencies of 100 megahertz and higher, the task is more difficult. In particular there is then a severe additional constraint as regards the acquisition of the synchronizing signal, which must occur in a time window very much smaller than the clock period. All these difficulties add up and make it not only expensive but also difficult to obtain a synchronization that is sufficiently precise by design. At the system level this results in additional system complexity and a degraded performance.

Other known solutions do not use synchronizing signals. Examples of such solutions are solutions using phase lock loops PLL in the converters, such as for example described in the document published on the Internet: "*Synchronizing Multiple High-Speed Multiplexed DACs for Transmit applications*", XP002492319, 21 Sep. 2006, pp 1-6, url=http://www.maxim.ic.com/an3901. However, they cause other problems. In particular, they generally lead to jitter in the sampling clocks, thereby also impacting the performance of the converters. These PLL solutions also cause problems with temperature stability, not to mention the complexity that they add in each converter.

SUMMARY OF THE INVENTION

The invention proposes to solve the technical problem relating to the distribution of the synchronizing signal. A solution is sought that is simpler to implement including when it is necessary to synchronize many converters to a high-frequency clock, for example of a frequency of 100 megahertz and higher, with all the required precision.

In a given architecture, the propagation delays of a signal from one point to another are set by the physical characteristics of the propagation pathway of this signal in the architecture in question. Rather than acting upstream, at the design stage, to set this delay for each converter as in the prior art, the ingenious idea of the invention is to arrange the converters in at least one series chain, and to replace the in-phase distribution of the synchronizing signal to all the converters with a transmission of this signal from one converter to the next in order to reach one by one all the converters of a chain, in combination with a parameterization, of each converter of the chain, which reflects the propagation delays of the synchronizing signal in this chain of converters and via which a synchronizing signal that is resynchronized is transmitted as output from each converter to the following converter. In each converter, the parameterization also allows the right reference-clock active front to be chosen, i.e. the front that returns the right signal for resetting the sampling clock generator, allowing the sampling clocks of all the converters to be synchronized in phase.

In this way, upstream constraints on the design and production of the application circuits are relaxed and therefore their cost is decreased. Furthermore, an effective synchronization of the converters is achieved at the expense of a step of setting configuration parameters of the synchronization, which is easy to implement and needs to be carried out only once as demonstrated, and of the addition of sequential and combinatorial logic elements in each converter, allowing the parameterization to be determined and applied.

Thus, the invention relates to a method for synchronizing digital/analogue and/or analogue/digital data converters to an active front of a common reference clock CLK, characterized in that the converters form at least one series transmission chain allowing a synchronizing signal emitted by a unit for controlling the converters to be transmitted, such that:

the converter of rank 1 in the chain has a synchronization input connected to a synchronization control output of the control unit;

each converter of rank j higher than 1 in the chain has a synchronization input connected to the synchronization output of the converter of rank j−1 in the chain; and the synchronizing method being characterized in that a procedure for synchronizing the converters of the chain to a CLK reference-clock active front activated by the control unit comprises the following steps, which are controlled by the control unit:

a step of initializing, in each converter, a synchronization configuration register including at least one polarity parameter defining the polarity of a reference-clock front for detection of signals input via the synchronization input of the converter as the polarity of the reference-clock active front or the inverse polarity; then sending to the synchronization control output of the control unit a synchronizing signal, which is a pulse of width at least equal to one reference-clock period;

the synchronizing method also being characterized in that each converter in the chain is configured to carry out the following steps:

a) a step of, on a CLK reference-clock front, that front has the polarity defined by the value of said polarity parameter configured in the converter, detecting a synchronizing signal input via the synchronization input, and b) a step of aligning with the following reference-clock active front the signal detected in step a), so as to deliver a synchronizing signal aligned with a reference-clock active front, and applying said signal to the synchronization output of the converter.

In one implementation, each converter in the chain is formed from n cores converting at a sampling frequency that is delivered by a divider by n of the reference-clock frequency, where n is a nonzero integer, and configured to carry out, following step b), the following steps:

c) a step of shifting said aligned synchronizing signal obtained in step b) by an integer number of reference-clock period(s), which integer number is defined by the value of a phase parameter delivered by said configuration register of the converter; and d) a step of using the obtained shifted signal as a signal for resetting said divider of frequency by n, said integer number defined by the phase parameter having a value comprised between 0 and n−1, inclusive of limits.

Each converter in the chain is configured to carry out a step e) of verifying the stability of an active level of the signal received via the synchronization input and acquired on the reference-clock front defined in the detecting step a) by the value of said polarity parameter, by comparing the first value acquired on said detecting front to at least one second value of said signal, which value is acquired on a front that is ahead, by a set time, of said detecting front and to at least one third value of said signal, which value is acquired on a front that is behind, by a set time, said detecting front, and if the values are not all identical, activating a corresponding flag bit in said configuration register of the converter.

The method comprises a setting phase allowing the polarity parameter of each converter, in succession from the first converter at the input of the chain to the last converter of the chain, to be configured by means of the flag bit of the configuration register of the converters, then a value p on the phase parameter of each converter to be configured on the basis of a determination of the integer number M of reference-clock periods separating the synchronizing pulse front output from the converter via its output from the synchronizing pulse front output from an upstream converter in the chain, and the value p of the phase parameter is such that the sum M+p is a multiple of n.

The invention also relates to an analogue/digital or digital/analogue data converter that comprises an input for receiving a synchronizing signal and an associated synchronizing circuit allowing the converter to be synchronized to an active front of a reference-clock signal, according to the method of the invention.

BRIEF DESCRIPTION OF THE DRAWINGS

Other features and advantages of the invention are presented in the following description, with reference to the appended drawings, in which.

DETAILED DESCRIPTION

The invention applies to systems for processing data that comprise a control unit that controls a set of analogue/digital and/or digital/analogue data converters that must work synchronously. In these architectures, the control unit, generally made up of a field-programmable gate array (FPGA) logic circuit, is designed to control the converters according to a master-slave communication schema, by means of a peripheral interface bus such as, for example, a serial peripheral interface (SPI) bus, which is a very widely used synchronous series data bus. The peripheral interface bus allows data to be exchanged between the control unit and the converters, in particular data (DATA) that are the data to be converted (digital-analogue converter) or that are the result of conversions (digital-analogue converter). These aspects will not be described in greater detail. They are well known to those skilled in the art.

Figure 1:
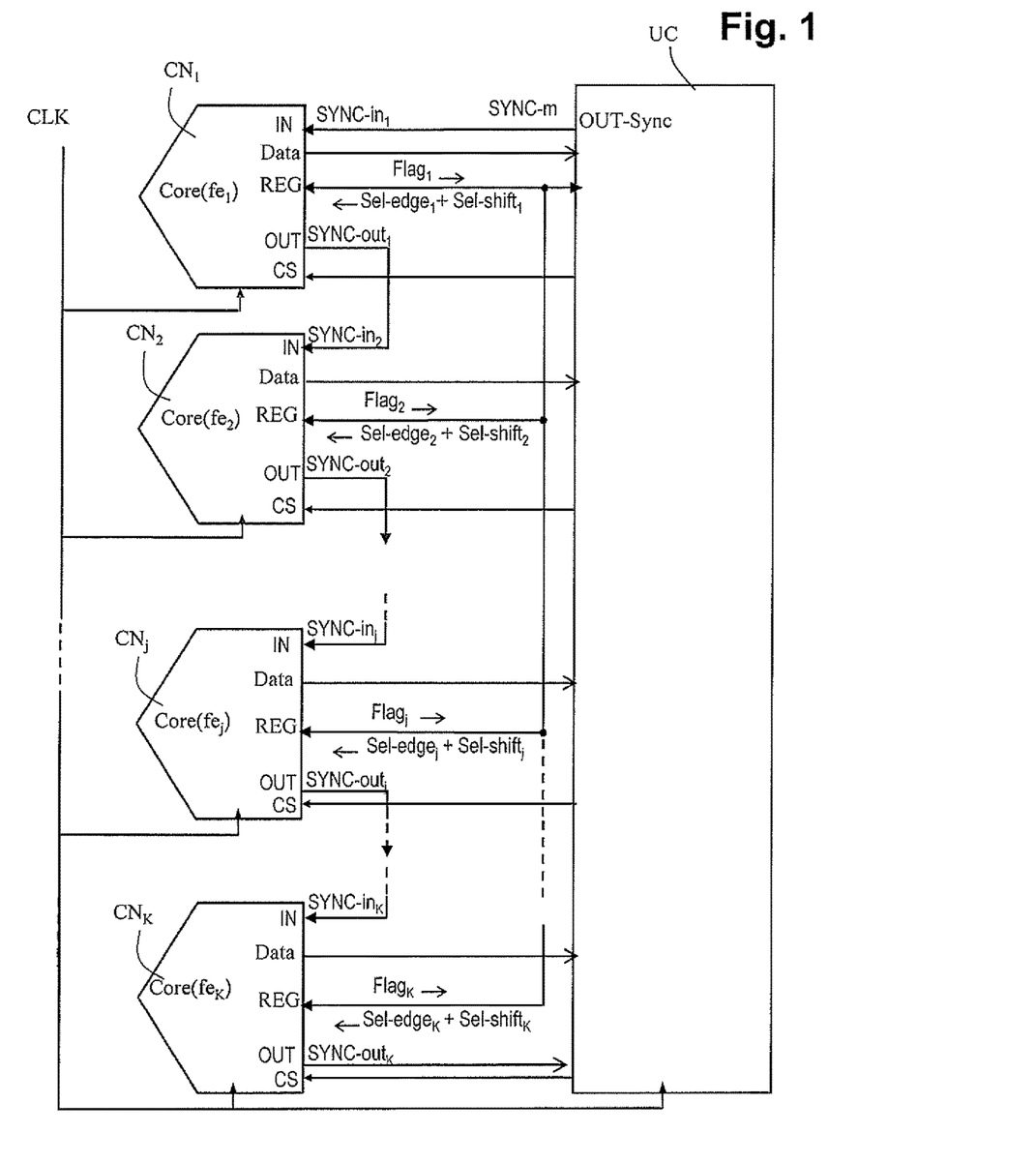
FIG. 1 illustrates a data architecture in which the converters are configured to form a series chain for propagating a synchronizing signal according to the invention.

FIG. 1 illustrates a processing architecture including K converters controlled by a control unit UC, which converters are arranged in a series chain that allows them to be synchronized according to the invention to a common reference clock CLK. In practice, this clock is electrically distributed to the control unit and converters using prior-art techniques, in order to ensure the synchronous distribution thereof to all the components.

According to the invention, each converter of the chain is configured to receive a synchronizing signal on an input terminal IN; and to transmit a synchronizing signal to the following converter, via an output terminal OUT. The series chain for distributing the synchronizing signal to the converters according to the invention may thus be formed in the following way: a synchronizing signal SYNC-m is emitted by the control unit UC of the converters; it is applied to the first converter of the chain and transmitted after resynchronization to the following converter and so on up to the last converter of the chain. The signal received on the input terminal IN of the converter of rank j in the chain is denoted SYNC-in$_j$; and the signal transmitted by the converter of rank j via its output terminal OUT, after detection of the signal SYNC-in$_j$ and alignment with a reference-clock active front as will be explained below, is denoted SYNC-out$_j$. Lastly, for the synchronizing method according to the invention, the synchronizing pulse has a duration (or width) that is at least equal to a CLK clock period, allowing the active level of the synchronizing signal to be acquired by each converter on at least one of the two, rising and falling, fronts of a CLK clock pulse.

Below, first the procedure for synchronizing converters according to the invention is described and then the procedures for determining the configuration parameters used by this procedure are described.

The conventions that have been selected will be specified beforehand: the CLK reference-clock active front to which the synchronization is made is the rising front; the default binary value of the parameters of the synchronization configuration register is zero (0). The synchronizing signal is a synchronizing pulse that is a positive logic pulse. The detection of such a signal corresponds to the detection or acquisition of an active level, which is, under the chosen convention, the high level. Those skilled in the art will be able to make the necessary transpositions and adaptations for systems using different conventions.

Figure 2:
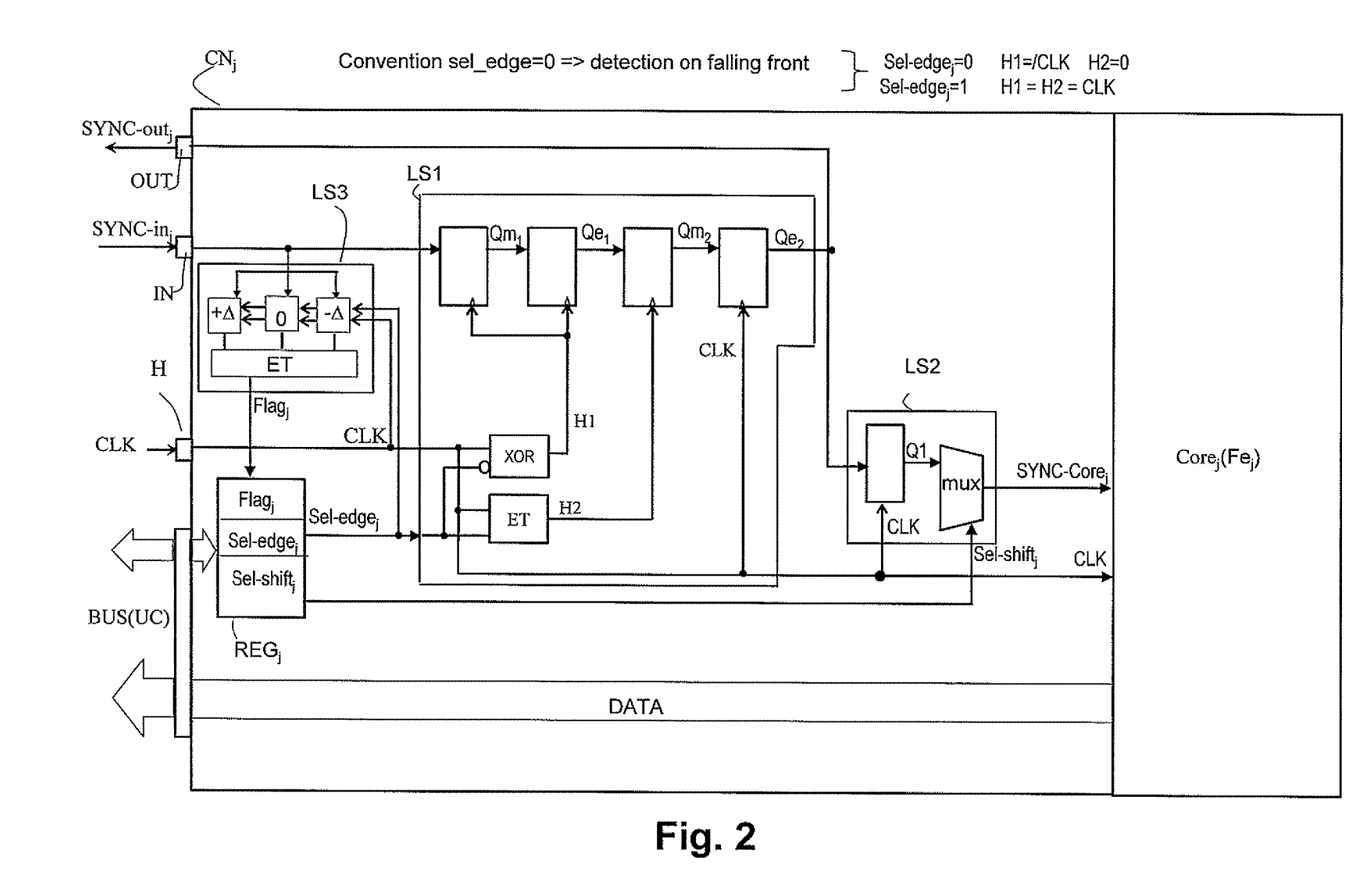
FIG. 2 is a simplified block diagram of a converter comprising circuit elements for implementing a synchronizing method in a chain of converters according to the invention.

FIG. 2 schematically illustrates the elements of the synchronizing circuit and synchronization configuration register that are provided in each converter in order to implement the synchronization of the converters of the chain according to the method of the invention.

The synchronizing circuit comprises sequential and combinatorial logic circuits. A first circuit LS1 allows a function for detecting and re-synchronizing a synchronizing signal SYNC_in$_j$ received as input to be provided. A second circuit LS2 is provided that allows a function for shifting this signal to be provided, in order to allow the frequency dividers of all the converters in the chain to be started in phase when these converters are made up of cores converting at a lower working frequency then the CLK clock frequency. How the functions of these two first circuits LS1 and LS2 are implemented depends on parameters defined in the synchronization configuration register REG$_j$. A third circuit LS3 makes it possible to detect whether the CLK clock front positioned by the polarity parameter is indeed the right front. If it is not, it allows a flag bit Flag$_j$ provided in the configuration register, which is especially used in the setting phase, to be activated in order to correctly determine the value of the polarity parameter for the converter in question.

Circuit LS1 and Polarity Parameter

It has been seen that the polarity parameter Sel-edge$_j$ is the parameter that allows, in each converter, the suitable polarity of the CLK clock front used to reliably acquire the active level of the synchronizing signal to be set.

This parameter is used by the first sequential and combinatorial logic circuit LS1 of the converter. This circuit LS1 receives as input the synchronizing signal Sync-in$_j$ received via the input terminal IN. It delivers as output the synchronizing signal Sync_out$_j$ that is transmitted to the output terminal. This circuit LS1 is designed, for the signal conventions indicated above, to:

detect a synchronizing pulse received as input, on a CLK clock front that may be the rising front or the falling front depending on the value of the polarity parameter Sel-edge$_j$; and deliver as output a synchronizing pulse that is synchronous with the reference clock, i.e. aligned with the clock active front, which under the adopted conventions is the rising front.

FIG. 2 shows an exemplary embodiment of this circuit, by way of illustration. In this example, the circuit LS1 comprises two pairs of flip-flops D controlled in master-slave mode, in series.

The first pair provides the detecting function. It is sequenced by an H1 clock signal that is generated by a logic gate, in the example an XOR gate that receives, via one input, the CLK clock signal, and via the other, the inverse of the polarity parameter Sel-edge$_i$. When Sel-edge$_i$=0, then H1=/CLK: that means that detection is on a falling front of CLK (FIG. 3); and when Sel-edge$_i$=1, H1=CLK: that means that detection is on a rising front of CLK (FIG. 4). Thus, the output Qm1 of the master flip-flop of the first pair takes the value of the signal SYNC-in$_j$ applied as input on (during) the low level of the clock H1; and preserves its preceding state on the high level; as for the output Qe1 of the slave flip-flop of the first pair, the opposite is true: it takes the value of the signal SYNC-in$_j$ applied as input on (during) the high level of the clock H1 and preserves its preceding state on the low level.

The second pair provides the function allowing alignment with a following CLK clock active front. In this second pair, the master flip-flop is sequenced by an H2 clock signal that is generated by a logic gate, in the example an AND gate that receives, via one input, the CLK clock signal, and via the other, the polarity parameter Sel-edge$_i$. When Sel-edge$_i$=0, then H2=0 (FIG. 3) and the output Qm2 of this flip-flop permanently copies its input, i.e. the signal Qe1; and when Sel-edge$_i$=1 (FIG. 4), H2=CLK. The slave flip-flop of the second pair is sequenced by the reference clock. Its output Qe2 delivers the synchronous synchronizing signal SYNC-out$_j$ to be transmitted via the output OUT.

Figure 3:
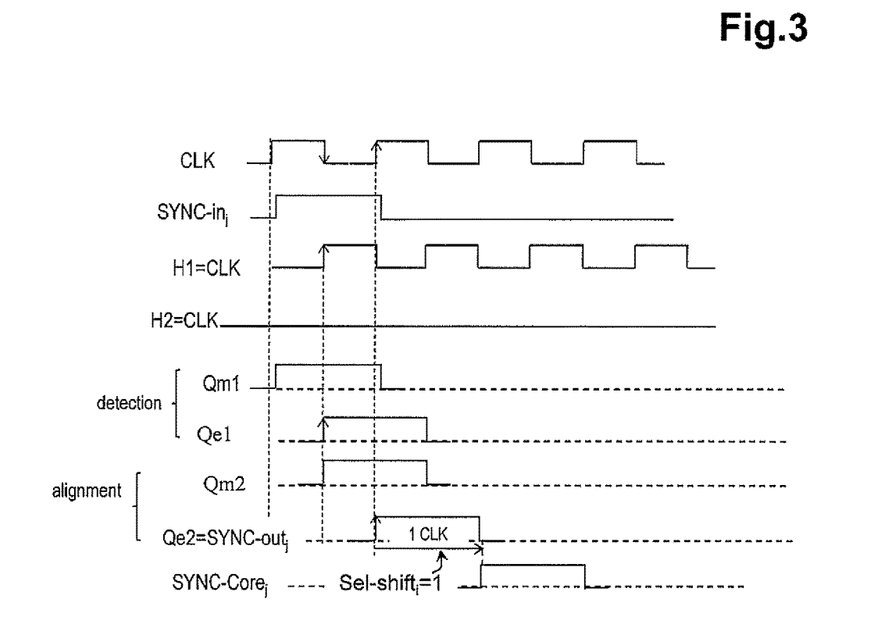
FIGS. 3 and 4 illustrate timing diagrams of the signals generated in each converter, depending on configuration parameters of the synchronization according to the invention.
Figure 4:
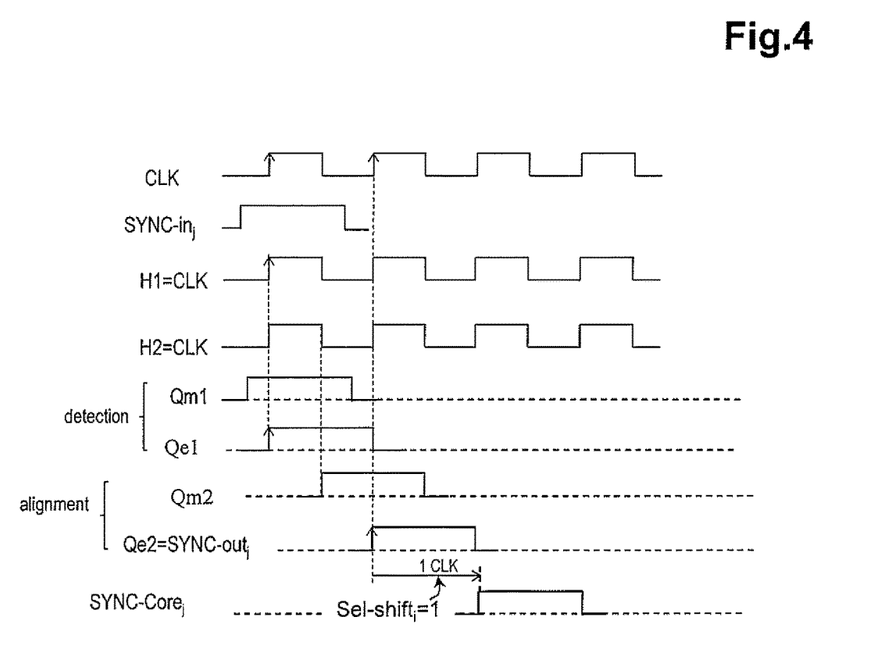

The timing diagram in FIG. 3 corresponds to the case where Sel-edge$_i$ has been set to 0 for this converter, indicating that the active level (1) of the signal SYNC_in$_j$ that will be (is) received is stable at the moment of a falling front of the clock CLK: detection by the first pair is on a falling front of CLK. Synchronisation by the second pair is on the following rising front of CLK.

The timing diagram in FIG. 4 corresponds to the opposite case in which Sel-edge$_i$ has been set to 1: i.e. the active level (1) of the signal SYNC-in$_j$ that will be (is) received is stable at the moment of a rising front of the clock CLK: detection by the first pair is on a rising front of CLK and synchronisation by the second pair is on the following falling front of CLK.

It will be noted that in both cases the detection and alignment are carried out over one reference-clock period.

Circuit LS2 and Phase Parameter

It has been seen that the phase parameter Sel-shift$_j$ is the parameter that allows the frequency dividers of the converters to be started in phase. If the converters are each formed with a single converting core the sampling frequency of which is the CLK clock frequency, this parameter is set to its default value (zero) in all the converters. When the converters are each formed with n converting cores, n being an integer at least equal to 2, the sampling clock of the converting cores is delivered by a divider by a factor n of the frequency of the clock CLK.

During the synchronizing procedure, the frequency dividers of the converters will not be reset to the same CLK clock active front, but instead their reset will be delayed depending on the propagation of the synchronizing signal from one converter to the next. However, the phase parameter ensures that they are reset to clock active fronts that considered pairwise are separated from each other by a number that is a multiple of n CLK clock periods. In this way, the sampling clocks all start in phase.

The phase parameter is applied to the second circuit LS2 of the synchronizing circuit of the converter. It receives as input the signal SYNC-out$_j$ delivered by the first circuit LS1; it delivers as output the signal SYNC-Core$_j$ applied to reset the sampling clock generator Fe$_j$ (frequency divider) used in the one or more cores of the converter.

In practice, the circuit LS2 comprises n−1 delay circuits, for example flip-flops D sequenced by the CLK clock signal, each circuit delaying the signal received as input by one CLK clock period; and a multiplexer having n input channels and one output channel, which is controlled by the phase parameter Sel-shift$_j$. This multiplexer receives as input the signal SYNC-Core$_j$ and the output of each of the n−1 delay circuits, and selects the input channel that corresponds to the shift set by the parameter Sel-shift$_j$.

Figure 5:
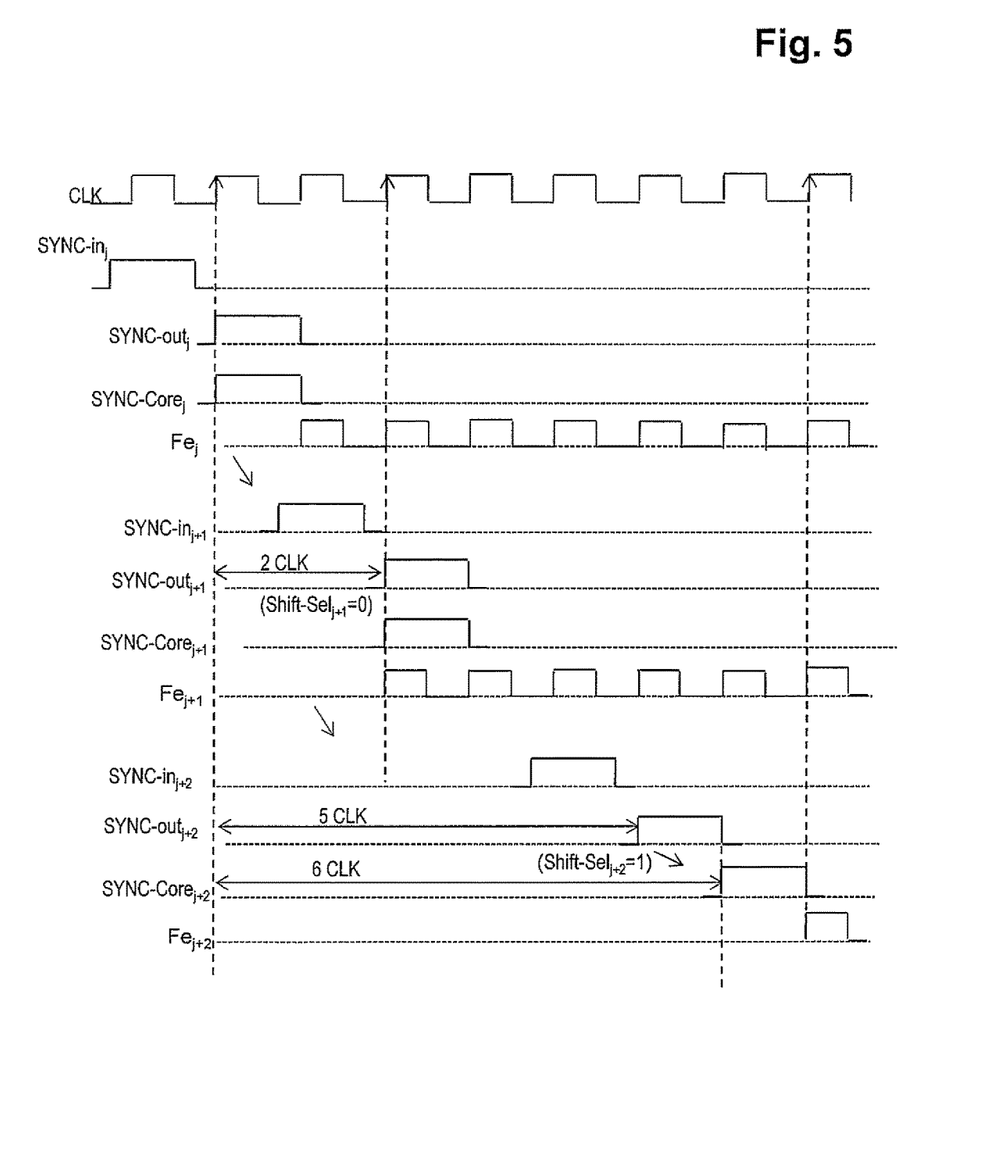
FIG. 5 is a timing diagram that more particularly illustrates the phase alignment of the sampling clocks in a chain of converters according to the method of the invention.

The timing diagram in FIG. 5 illustrates the effects of the circuit LS2 and the phase parameter. It shows the input, output and core synchronizing signals (SYNC-in$_j$, SYNC-out$_j$, SYNC-Core$_j$) of three successive converters of the chain, which comprise n=2 cores working at half the frequency of the CLK clock frequency. In this timing diagram, the output synchronizing signal SYNC-out$_j$ output from the most upstream converter CN$_j$ is taken as a reference. For the two converters CN$_j$ and CN$_{j+1}$, the active fronts of their output signals SYNC-out$_j$ and SYNC-out$_{j+1}$ are separated by 2 CLK clock periods: these two signals may be applied without shift (Sel-shift$_j$ and Sel-shift$_{j+1}$=0): their sampling clocks Fe$_j$ will start in phase. For the two converters CN$_j$ and CN$_{j+2}$, the active fronts of their output signals SYNC-out$_j$ and SYNC-out$_{j+2}$ are separated by 5 CLK clock periods, which is not a multiple of 2. In the example, a shift of 1 CLK clock period is then added to the signal SYNC-out$_{j+2}$, to obtain a number that is a multiple of 2 (by setting the phase parameter Sel-shift$_{j+2}$ of the converter CN$_j$+2 to the value 1). Thus, the clocks of these three converters Fe$_j$, Fe$_{j+1}$ and Fe$_{j+2}$ will all start in phase, as illustrated in FIG. 5. Thus, the value of the phase parameter of each converter with respect to an upstream converter in the chain is determined.

Circuit LS3 and Flag Bit

Figure 6:
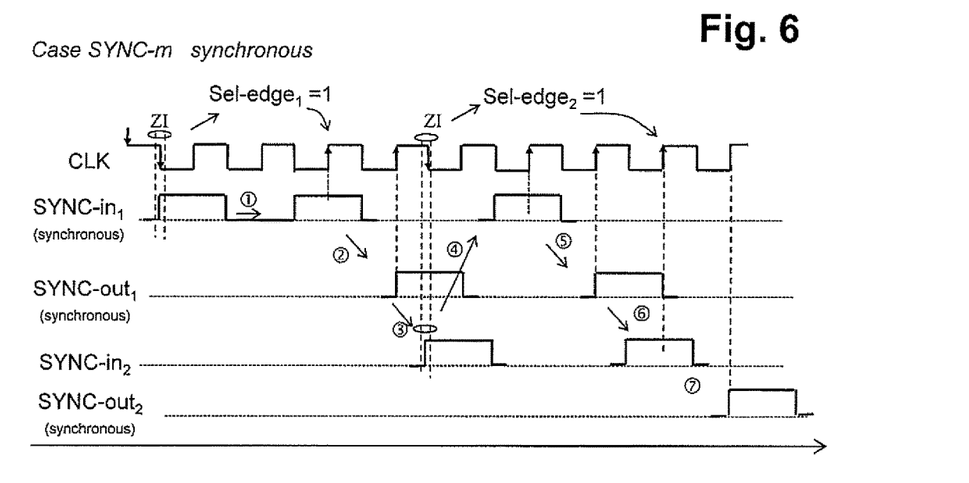
FIGS. 6 and 7 are a timing diagram of the signals and a flowchart of the steps of a setting procedure according to the invention, for configuring the polarity parameter of each converter, using a synchronizing signal emitted by the control unit and that is synchronous with the reference clock.

The flag bit Flag$_j$ of the configuration register of a converter makes it possible to signal to the control unit that the acquisition of the input synchronizing signal SYNC-in$_j$ is not reliable, i.e. that the CLK clock front defined by the polarity parameter for detection of the active level of this signal (circuit LS1) falls in a zone in which this signal is unstable, and that therefore it must be modified. FIG. 6 illustrates this situation: the active pulse front of the signal SYNC-in$_1$ is concomitant with the CLK clock front set by the parameter Sel-edge$_1$ for the detection, which here is the falling front. This is a zone of instability ZI of the signal and hence the detection is unreliable. The third circuit LS3 of the synchronizing circuit of the converter allows this situation to be detected, and the flag bit Flag$_j$ to be activated where appropriate.

In practice, this circuit LS3 comprises three detecting stages that each receive the input synchronizing signal SYNC-in$_j$ and that are sequenced using the reference clock CLK. A first stage is configured to detect an active level of the signal SYNC-in$_j$ on the CLK clock front determined by the default value of the polarity parameter Sel-edge$_j$. The two other stages detect on a front (−Δ) slightly ahead of this clock front and a front (+Δ) slightly therebehind, respectively. At the high frequencies with which we are concerned, this slight positive or negative delay is typically about ten picoseconds ($10^{-12}$ s). If the three stages deliver as output the same logic value, corresponding to the active level of the signal, it means that this level is well established at the time of the detection front. If at least one delivers a different logic value, it means that the signal SYNC-in$_j$ was in the process of rising to the high value (or decreasing to the low value): the detection front is therefore in a zone of instability ZI. The circuit LS3 then activates the flag bit Flag$_j$ in the configuration register, in the example by positioning it to the value 1. In practice, the various detecting stages are designed substantially like the detecting stage of the circuit LS1, while furthermore including delay circuits for generating the detection fronts ahead and behind the reference-clock front. This flag bit is especially used in the setting phase to modify the value of the polarity parameter of the converter. Another use is described below, in the procedure for synchronizing the chain of converters.

Procedure for Synchronizing the Chain of Converters

During the setting phase, which will be described below, the control unit UC stores the polarity and phase parameters determined for each converter in memory, for example in a non-volatile memory.

Each time it is turned on, the control unit programmes the configuration registers of each of the converters. It then triggers the procedure for synchronizing the converters.

In one embodiment, this procedure is triggered by the emission by the control unit of a synchronizing signal SYNC-m that is synchronous with the clock CLK, i.e. the pulse is emitted on a CLK clock active front.

By virtue of the polarity and phase parameters configured for each converter, this synchronizing signal will propagate from the first converter to the last converter of each converter chain formed according to the invention, while generating, on passage through each converter, a signal for synchronizing the one or more converting cores, which signal is correctly positioned so that at the end of the procedure, all the sampling clocks will be in phase, as for example illustrated by the timing diagram in FIG. 5.

In one variant, provision may be made for the synchronizing procedure to be triggered by the emission by the control unit of a synchronizing signal SYNC-m that is asynchronous. In this case, there is an uncertainty in the detection of the synchronizing pulse by the first converter CN$_1$ at the chain input. This uncertainty is removed by making provision for the control unit to verify the state of the flag bit of this converter CN$_1$: if it is not activated, it means that the active pulse level was well and stably established at the time of the detection front positioned by the polarity parameter. If it is activated, the control unit emits a new asynchronous synchronizing pulse. Provided that the first converter has correctly detected the input synchronizing pulse, and as it transmits as output a synchronizing signal SYNC-outs that is by construction synchronous, the synchronizing procedure may continue in the following converters, as described above for a synchronous signal SYNC-m.

Advantageously, the synchronization output terminal of the last converter of the chain is looped back to the control unit: the control unit thus receives an indication of the end of the phase of synchronizing the converters of each chain.

Procedure for Setting the Configuration Parameters

For each converter chain formed according to the invention a setting phase is required to configure, in each converter, the polarity and phase parameters of the synchronizing procedure. After the system is turned on, the converters are initialized: in particular the configuration registers of the converters are initialized to a default value, which is generally zero. Therefore, in all the converters: Sel-edge$_j$=0 and Sel-shift$_j$=0. Under the adopted conventions, this means that, in the circuits LS1 of all the converters, the CLK clock front for detection is the falling front; and the circuits LS2 of all the converters select the no-shift synchronization input channel.

Figure 7:
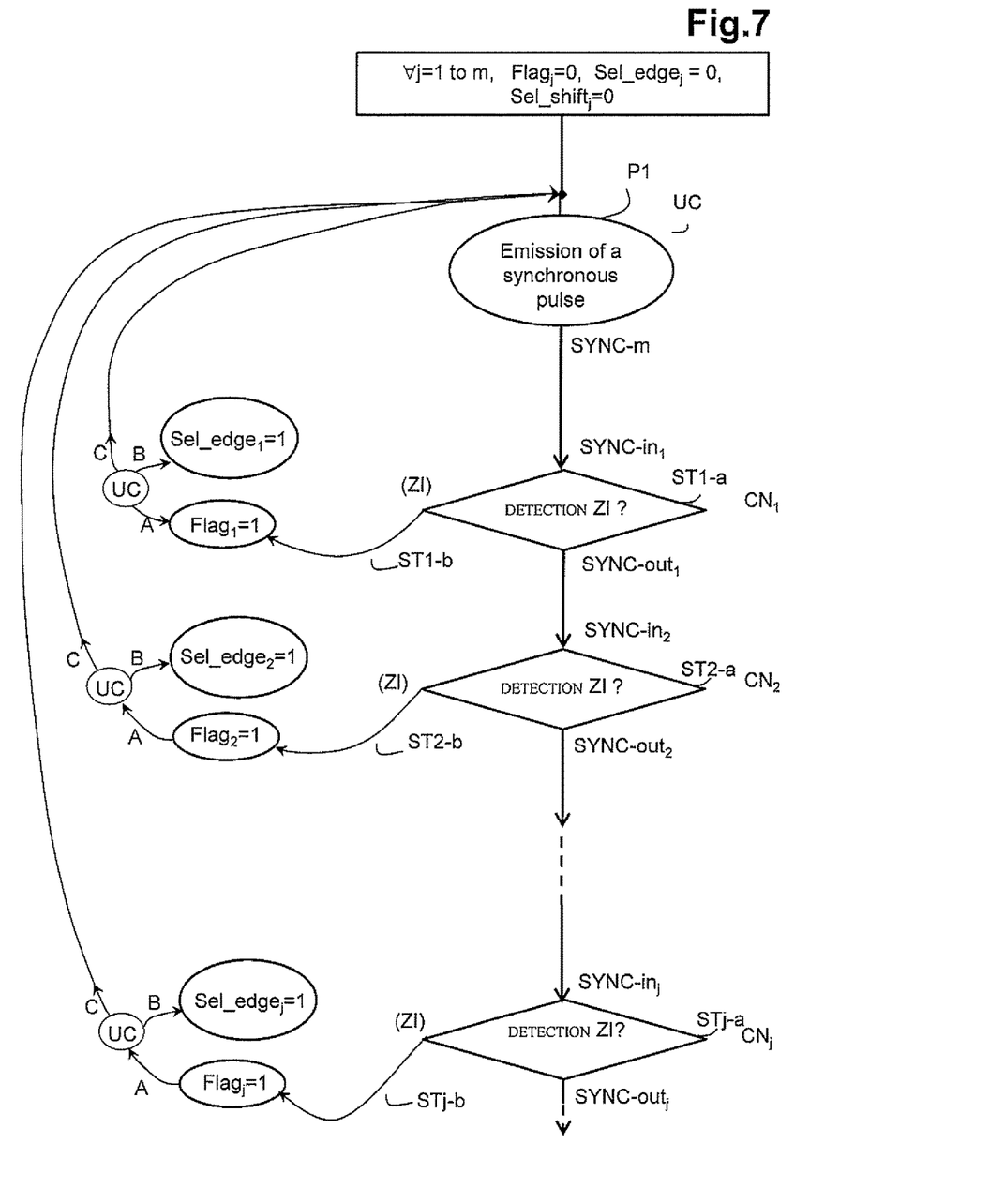

The control unit is configured to activate a setting sequence P1, to determine step by step the polarity parameters of the converters, as illustrated by the timing diagram in FIG. 6 and the flowchart of steps in FIG. 7.

This phase starts with the emission of a synchronizing signal SYNC-m (a pulse) synchronized to a CLK clock active front. The control unit then monitors the converters to detect whether a flag bit is activated.

At the converter level, the sequence is as follows:

The synchronizing pulse emitted by the control unit arrives via the input of the chain at the first converter $CN_1$ after a set delay (which there is no need to know) that depends only on the characteristics of the conduction pathway of the signal from the output OUT-sync of the control unit to the input IN of this converter (FIG. 1). The converter detects the signal SYNC-in$_1$ received as input (circuit LS1) and verifies (circuit LS3) whether this detection took place in a zone of instability ZI of this signal (step ST-a). If this is not the case, the signal propagates to the following converter $CN_2$.

However if, as illustrated in FIG. 6, the propagation delay between the output OUT-sync of the control unit and the input IN of this converter is such that the high level of the signal SYNC-in$_i$ is being reached at about or at the time of the detection front, the falling front in the example, which is the CLK clock front that has the polarity defined by the default value of the polarity parameter Sel-edge$_1$, the converter (via its circuit LS3) activates its flag bit Flag 1 (step ST-b).

The control unit will then detect the activation of the flag bit Flag$_1$ of the configuration register of the converter $CN_1$ and will:

reset it to zero (step A);
position to 1 the polarity parameter Sel-edge$_1$ (step B); and
launch a new synchronizing sequence P1 (step C).

A new synchronous synchronizing signal SYNC-m is then sent to the first converter of the chain as illustrated in ① in FIG. 6. This time round, the polarity parameter of the first converter is suitably positioned: the synchronizing pulse is reliably detected and the converter transmits as output a pulse SYNC-outs that is resynchronized to the CLK clock active front, as illustrated in ② in FIG. 6.

As above, the synchronizing pulse arrives at the input of the second converter $CN_2$ after a set delay that depends only on the characteristics of the conduction pathway of the signal from the output of the preceding converter to the input of this converter.

In turn, this converter $CN_2$ detects the signal SYNC-in$_2$ received as input (circuit LS1) and verifies (circuit LS3) whether this detection took place in a zone of instability ZI of the signal (step ST-a). If this is not the case, the signal propagates to the following converter, $CN_3$.

In the example, as illustrated in ③ in FIG. 6, the converter detects a zone of instability ZI for the polarity defined by the parameter SEL-edge$_2$ (circuit LS3) and activates its flag bit Flag$_2$ (step ST-b).

As seen above, the control unit detects this; zeros this flag bit Flag$_2$ (step A); positions to 1 the value of the polarity parameter Sel-edge$_2$ of the converter $CN_2$ (step B); and activates a new synchronizing sequence P1 (step C).

A new synchronous synchronizing signal SYNC-m is emitted, as illustrated in ④ in FIG. 6.

This time round, the synchronizing signal will be correctly detected and transmitted by the two already parameterized first converters. The propagation delay of the synchronizing pulse from its emission to the input of the third converter is thus well determined and set. It is then possible to determine the polarity parameter suitable for this third converter, as described above. In this way, the polarity parameter that is suitable for each successive converter in the chain is thus determined up to the last one.

It will be noted that this setting procedure is compatible with a synchronizing procedure initiated by the control unit with a synchronizing signal SYNC-m that is synchronous or asynchronous, as has already been described above.

Figure 8:
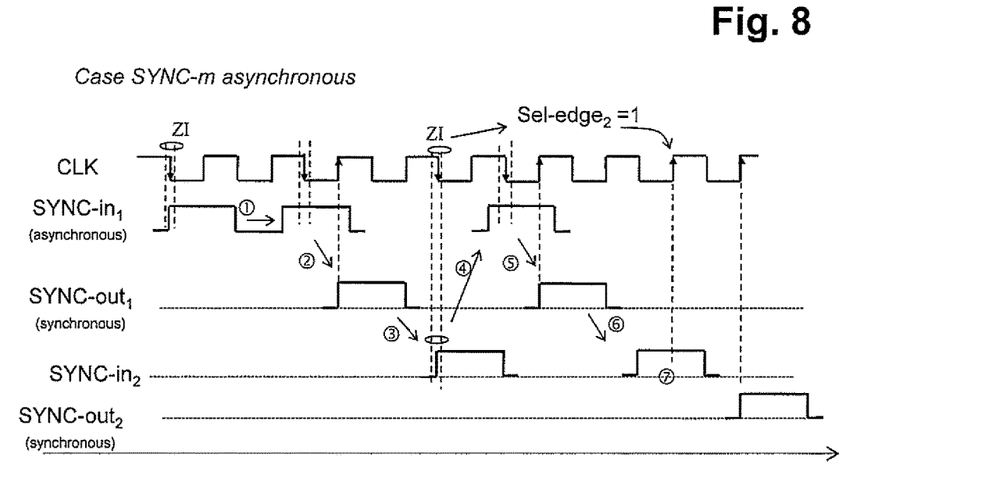
FIGS. 8 and 9 illustrate a variant of the setting procedure using a synchronizing signal emitted by the control unit and that is asynchronous.
Figure 9:
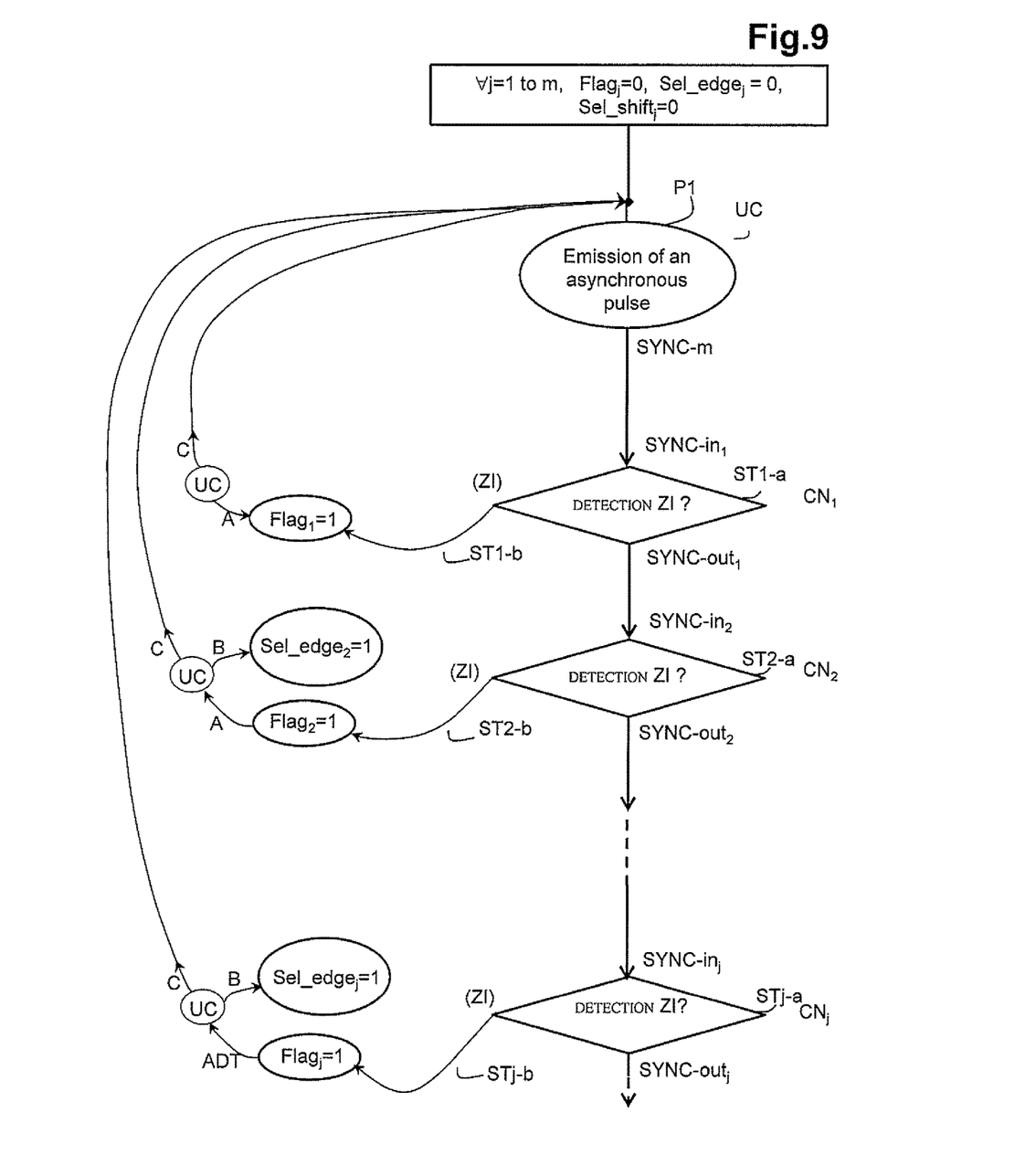

FIGS. 8 and 9 illustrate one variant of the setting sequence, in which variant the control unit emits an asynchronous synchronizing signal SYNC-m. In this case, the control unit does not modify the polarity parameter of the first converter $CN_1$ if its flag bit is activated; it resets the flag bit and emits a new asynchronous synchronizing signal SYNC-m, and it repeats this until the first converter correctly detects the signal that it receives as input. The sequence is unchanged for the other converters of the chain. It will be noted that this setting procedure is compatible only with a synchronizing procedure initiated by the control unit with a synchronizing signal SYNC-m that is also asynchronous.

Once all the polarity parameters have been configured, it is then possible to configure the phase parameters Sel-shift$_j$ of the converters of the chain. Specifically, all the propagation delays of the synchronizing signal in the chain have been determined: the detections are reliable and the synchronizing signals output via the outputs OUT of the converters are all synchronized to a CLK clock active front. It is therefore possible to determine the number of CLK clock periods separating the synchronizing pulse front output from each converter from a synchronizing pulse front output from another converter, and to do so for all the chain. The principle is, as illustrated in FIG. 5, to measure the separation between the synchronizing pulse fronts output from two converters, and, when this separation is equal to an integer number M of CLK clock periods that is not a multiple of n, the value of the phase parameter of the most downstream converter is set to the value p such that M+p is a multiple of n. p may therefore be set to 0, 1, . . . n−1.

This may be done in various ways, for example by observing, using an oscilloscope, the output signals or synchronizing signals; or it may be done by precise calculation of the propagation delay between the output OUT of a converter and the input IN of the following converter, this calculation taking into account the material of the conductor, its length, characteristics of solder joints, characteristics of the input and output stage, etc.; or even using test sequences generated by the converters. This determination is not carried out, as for the polarity parameter, via an automatic procedure controlled by the control unit. However, once this determination has been carried out, the value of the phase parameter thus determined for each converter is stored in a memory of the control unit. These values are used to configure the converters each time the system is turned on.

The configuration register of each converter thus in practice comprises 1 bit reserved for the flag bit, 1 bit reserved for the polarity parameter and r bits, where $n=2^r$, reserved for the phase parameter.

Figure 10:
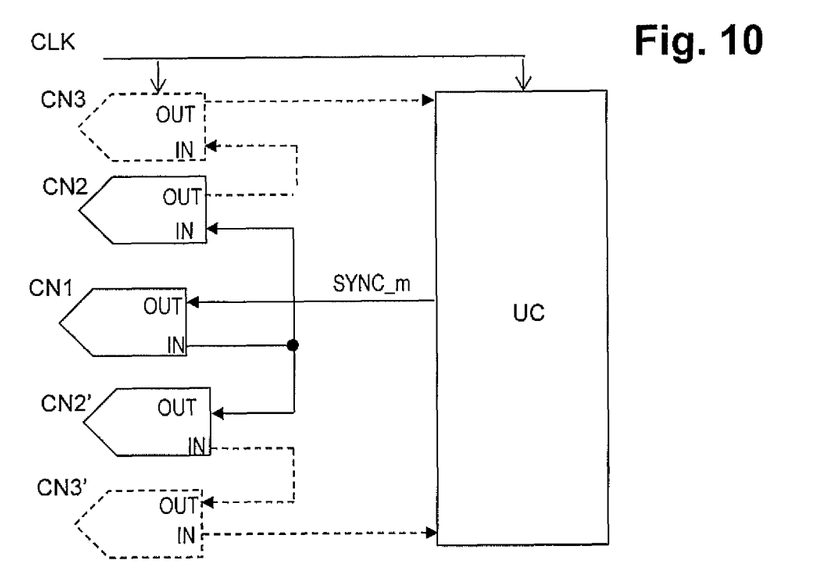
FIGS. 10 and 11 schematically show various ways of forming (a) converter chain(s) that are compatible with a synchronizing method according to the invention.
Figure 11:
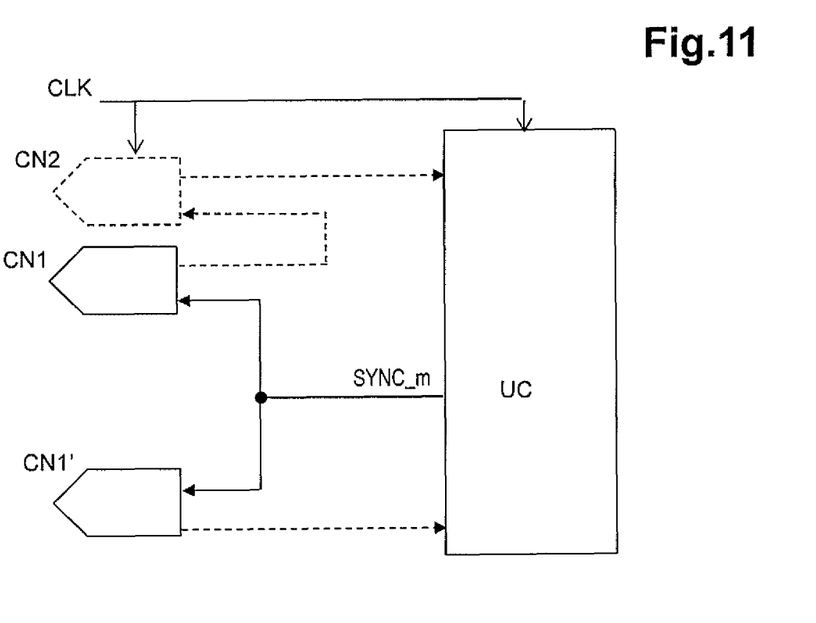

The invention that has just been described easily accommodates all forms of arrangement of the converters that may be found in architectures for processing data in the various fields of application: an arrangement in series, in parallel, in a tree having a number of branches, etc., or combinations of these arrangements. FIGS. 10 and 11 give examples of such tree (FIG. 10) or hybrid (FIG. 11) configurations. The synchronizing method and the associated setting method, which were explained above, apply in the same way to each of the chains (of one or more converters) formed in these systems.

The invention is not limited to architectures using an SPI bus as master-slave interface bus between the control unit and the converters.

The invention claimed is:

1. A method for synchronizing digital/analogue and/or analogue/digital data converters to an active front of a common reference clock CLK, characterized in that the converters form at least one series transmission chain allowing a synchronizing signal emitted by a unit for controlling the converters to be transmitted, method such that:
   the converter of rank 1 in the chain has a synchronization input connected to a synchronization control output of the control unit;
   each converter of rank j higher than 1 in the chain has a synchronization input connected to the synchronization output of the converter of rank j–1 in the chain;
the synchronizing method being characterized in that a procedure for synchronizing the converters of the chain to a reference-clock active front activated by the control unit comprises the following steps, which are controlled by the control unit:
   a step of initializing, in each converter, a synchronization configuration register including at least one polarity parameter defining the polarity of a reference-clock front for detection of signals input via the synchronization input of the converter as the polarity of the reference-clock active front or the inverse polarity; then sending to the synchronization control output of the control unit a synchronizing signal, which is a pulse of width at least equal to one reference-clock period; and
the synchronizing method also being characterized in that each converter in the chain is configured to carry out the following steps:
   a) a step of detecting, on a CLK reference-clock front, that front has the polarity defined by the value of said polarity parameter configured in the converter, a synchronizing signal input via the synchronization input, and
   b) a step of aligning with the following reference-clock active front the signal detected in step a), so as to deliver a synchronizing signal aligned with a reference-clock active front, and applying said signal to the synchronization output of the converter.

2. The method of claim 1, wherein each converter in the chain is formed from n cores converting at a sampling frequency that is delivered by a divider by n of the reference-clock frequency, where n is a nonzero integer, and configured to carry out, following step b), the following steps:
   c) a step of shifting said aligned synchronizing signal obtained in step b) by an integer number of reference-clock period(s), which integer number is defined by the value of a phase parameter delivered by said configuration register of the converter; and
   d) a step of using the obtained shifted signal as a signal for resetting said divider of frequency by n, said integer number defined by the phase parameter having a value comprised between 0 and n−1, inclusive of limits.

3. The method of claim 2, wherein each converter in the chain is furthermore configured to carry out the following step:
   e) a step of verifying the stability of an active level of the signal received via the synchronization input and acquired on the reference-clock front defined in the detecting step a) by the value of said polarity parameter, by comparing the first value acquired on said detecting front to at least one second value of said signal, which value is acquired on a front that is ahead, by a set time, of said detecting front and to at least one third value of said signal, which value is acquired on a front that is behind, by a set time, said detecting front, and if the values are not all identical, activating a corresponding flag bit in said configuration register of the converter.

4. The method of claim 2, wherein the synchronizing signal emitted by the control unit is a signal synchronized to an active front of the reference clock CLK.

5. The method of claim 2, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

6. The method of claim 1, wherein each converter in the chain is furthermore configured to carry out the following step:
   e) a step of verifying the stability of an active level of the signal received via the synchronization input and acquired on the reference-clock front defined in the detecting step a) by the value of said polarity parameter, by comparing the first value acquired on said detecting front to at least one second value of said signal, which value is acquired on a front that is ahead, by a set time, of said detecting front and to at least one third value of said signal, which value is acquired on a front that is behind, by a set time, said detecting front, and if the values are not all identical, activating a corresponding flag bit in said configuration register of the converter.

7. The method of claim 6, wherein the flag bit of the configuration register of the converters is used by the control unit in a setting phase to change the value of the polarity parameter in each converter of a chain, from a first binary value initialized by default to a second binary value, and in that, in said setting phase, the control unit emits a new synchronizing signal each time a flag bit is activated in the configuration register of a converter of the chain, said setting phase allowing the polarity parameter of each converter, in succession from the first converter at the input of the chain to the last converter of the chain, to be configured.

8. The method of claim 7, wherein after said step of setting the polarity parameters of the converters, a value p of the phase parameter of each converter is determined on the basis of a determination of the integer number M of reference-clock periods separating the synchronizing pulse front output from the converter via its output from the synchronizing pulse front output from an upstream converter in the chain, and the value p of the phase parameter is such that the sum M+p is a multiple of n.

9. The method of claim 8, wherein the synchronizing signal emitted by the control unit is a signal synchronized to an active front of the reference clock CLK.

10. The method of claim 8, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

11. The method of claim 7 wherein the synchronizing signal emitted by the control unit is a signal synchronized to an active front of the reference clock CLK.

12. The method of claim 7, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

13. The method of claim 6, wherein the synchronizing signal emitted by the control unit is a signal synchronized to an active front of the reference clock CLK.

14. The method of claim 6, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

15. The method of claim 1, wherein the synchronizing signal emitted by the control unit is a signal synchronized to an active front of the reference clock CLK.

16. The method of claim 15, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

17. The method of claim 1, wherein the procedure for synchronizing the converters of the chain comprises the emission, by the control unit, of an asynchronous synchronizing signal and in that the control unit emits a new asynchronous synchronizing signal each time the flag bit is activated in the configuration register of the converter of rank 1 at the input of the chain.

18. An analogue/digital or digital/analogue data converter comprising an input for receiving a synchronizing signal and an associated synchronizing circuit allowing the converter to be synchronized to an active front of a reference-clock signal, the converter comprising a configuration register that may be read from and written to via an interface bus by a control unit of the converter, said register comprising at least one polarity parameter defining a reference-clock-front polarity for detection of said synchronizing signal received as input, and the synchronizing circuit comprising a detecting circuit that comprises:
 a) a stage for detecting, on a reference-clock front that has the polarity defined by the binary value of said polarity parameter, an active level of said received synchronizing signal, and
 b) a stage for aligning the synchronizing signal detected by the detecting stage, which delivers as output a synchronizing signal aligned with a reference-clock active front, and said aligned synchronizing signal is applied to a synchronization output of the converter.

19. The converter of claim 18, which is formed from n cores converting at a sampling frequency that is delivered by a divider by n of the reference-clock frequency, where n is a nonzero integer, characterized in that the configuration register contains another phase parameter the value of which is equal to an integer number comprised between 0 and n−1, inclusive of limits, and in that the synchronizing circuit comprises a shifting circuit configured to apply to the signal delivered as output from said aligning stage, a shift of an integer number of reference-clock periods, which is given by the value of said phase parameter, and to use the obtained shifted signal as a signal for resetting the divider of frequency by n.

20. The converter of claim 18, wherein the synchronizing circuit comprises a circuit for verifying the stability of an active level of the synchronizing signal received via the input, which comprises a first stage for acquiring a level of said synchronizing signal on a reference-clock front having the polarity defined by the value of said polarity parameter, at least one second stage for acquiring a level of said synchronizing signal on a front that is ahead, by a set time, of said reference-clock front defined in the first stage, and at least one third stage for acquiring a level of said synchronizing signal on a front that is behind, by a set time, said reference-clock front defined in the first stage, and if the values delivered by the various stages are not all identical, the output of said verifying circuit activates a flag bit in said configuration register of the converter.

* * * * *